United States Patent [19]

Kasahara et al.

[11] Patent Number: 4,553,099
[45] Date of Patent: Nov. 12, 1985

[54] ELECTROSTATIC VOLTAGE SENSOR

[75] Inventors: Yukio Kasahara; Ritsuo Inaba, both of Hirakata; Kiyotaka Wasa, Nara, all of Japan

[73] Assignee: Matsushita Electric Industrial Co., Ltd., Kadoma, Japan

[21] Appl. No.: 356,145

[22] Filed: Mar. 8, 1982

[30] Foreign Application Priority Data

Mar. 6, 1981 [JP] Japan ................................ 56-32979
Apr. 7, 1981 [JP] Japan ................................ 56-52725
Apr. 7, 1981 [JP] Japan ................................ 56-52726

[51] Int. Cl.$^4$ ........................................ G01R 29/12
[52] U.S. Cl. ................................... 324/458; 324/72; 324/118; 333/152
[58] Field of Search .................... 324/458, 72; 331/25; 329/122; 333/150, 152; 310/313 R

[56] References Cited

U.S. PATENT DOCUMENTS 3,189,825  6/1965  Lahti et al. ........................... 329/122
3,384,820  5/1968  Dimeff et al. ........................ 324/118
3,818,336  6/1974  Marshall .............................. 324/118
4,205,267  5/1980  Williams ............................. 324/458
4,233,573  11/1980 Grudkowski ................... 310/313 R

FOREIGN PATENT DOCUMENTS 2290787  4/1976  France .
2324166  8/1977  France .
1349448  4/1974  United Kingdom .

OTHER PUBLICATIONS

Inaba et al., "An Electrostatic Voltage Sensor Using Surface Acoustic Waves", 1982 Ultrasonics Symposium Proceedings, San Diego, Oct. 27-29, 1982.
Inaba et al., "An Electrostatic Voltage Sensor Using Surface Acoustic Waves", IEEE Transactions on Sonics and Ultrasonics, vol. SU-29, No. 6, Nov. 1982.
Kasahara et al., "An Electrostatic Voltage Sensor Using Surface Acoustic Waves", Proceedings of the 1st Symposium on Ultrasonic Electronics, Tokyo, Dec. 15-17, 1980.
E. Harnik and E. Sader, "Attenuation and Phase Velocity of Surface Acoustic Waves Interacting with Charge Carriers in this Metal Films", published Oct. 2, 1978.
H. Kuzmany, "Acoustoelectric Interaction in Semiconductors", Review Article, Phys. Stat. Sol. (a)25,9, (1974).

Primary Examiner—Ernest F. Karlsen
Assistant Examiner—Kevin D. O'Shea
Attorney, Agent, or Firm—Wenderoth, Lind & Ponack

[57] ABSTRACT

An electrostatic voltage sensor which includes a surface acoustic wave propagating medium and transmitting and receiving transducers coupled to the medium. The voltage sensor is provided with a separate voltage collecting member different from the electrode for applying a voltage or electric field, and the voltage obtained in the voltage collecting member is varied by a predetermined frequency for being applied to the electrode so as to detect external voltage by the variation component of the oscillating frequency.

5 Claims, 14 Drawing Figures

ELECTROSTATIC VOLTAGE SENSOR

BACKGROUND OF THE INVENTION

The present invention generally relates to a voltage measuring device and more particularly, to an electrostatic voltage sensor compact in size at high accuracy, and having a large voltage measuring range.

For a voltmeter, there have commonly been required various conditions such as a high input impedance, a favorable stability against temperature variation and during operation, a high resistance against noises, a sufficient withstand voltage characteristic, and a high reading accuracy, etc.

Conventionally, a vacuum tube type voltmeter has been widely employed as a voltmeter having a high input impedance. However, the known vacuum tube type voltmeter as described above has disadvantages in that, due to the employment of vacuum tubes, characteristics thereof are rather unstable, with consequent large heat noises and difficulties in the reduction of its size. Accordingly, it has been a recent trend that voltmeters employing field effect transistors (FET) are gradually taking the place of the vacuum tube type voltmeters, owing to such advantages that the former have input impedance generally equal to the vacuum tube type voltmeters with less heat noises, and can be formed into a compact size. The known voltmeters employing field effect transistors, however, still have drawbacks in that, since withstand voltage characteristics of the field effect transistors are not sufficient, the voltmeters employing such field effect transistors are extremely weak against excessively large voltages, normally withstanding voltages of only about several tens of volts or thereabout.

On the other hand, in electronic equipment and appliances currently in use, it is not very uncommon that voltages in the order of several hundred to several thousand volts are utilized, and thus, the voltmeters employing the field effect transistors have been unsuitable for applications to measurements of circuit voltages for the electronic equipment and appliances as described above.

SUMMARY OF THE INVENTION

Accordingly, an essential object of the present invention is to provide an electrostatic voltage sensor which is capable of measuring voltages over a wide range at high efficiency, with substantial elimination of disadvantages inherent in the conventional voltage measuring devices of this kind.

Another important object of the present invention is to provide an electrostatic voltage sensor of the above described type which has a high signal-to noise ratio and is superior in measuring accuracy.

A further object of the present invention is to provide an electrostatic voltage sensor of the above described type which is capable of being used over a long period of time.

A still further object of the present invention is to provide an electrostatic voltage sensor of the above described type which is simple in construction and highly reliable in functioning, and can be readily manufactured on a large scale at low cost.

In accomplishing these and other objects, according to one preferred embodiments of the present invention, there is provided an electrostatic voltage sensor which includes at least a surface acoustic wave propagating medium composed of piezo-electric material, a pair of transmitting and receiving transducers for transmitting and receiving the surface acoustic wave provided on the surface acoustic wave propagating medium, an oscillating circuitry including an amplifier having its input terminal connected to the receiving transducer and its output terminal connected to the transmitting transducer, electrode member for applying electric field to the surface acoustic wave propagating medium and a voltage collecting member disposed in the vicinity of an object to be measured for voltage and connected to either one of the electrode members, a voltage varying circuitry for varying the voltage applied to the either one of the electrode members from the voltage collecting member at a predetermined constant frequency, and a voltage detecting circuitry for detecting the voltage of the objected to be measured by detecting output frequency of the oscillating circuitry.

By the arrangement according to the present invention as described above, an improved electrostatic voltage sensor has been advantageously presented through simple construction and at high reliability.

BRIEF DESCRIPTION OF THE DRAWINGS

These and other objects and features of the present invention will become apparent from the following description taken in conjunction with the preferred embodiment thereof with reference to the accompanying drawings, in which.

Before the description of the present invention proceeds, it is to be noted that like parts are designated by like reference numerals throughout several views of the accompanying drawings.

DETAILED DESCRIPTION OF THE INVENTION

With a particular attention directed to a phenomenon that, upon impression of an electric field onto a piezo-electric element, elastic characteristics thereof are correspondingly altered, the present inventors have developed an improved voltmeter which utilizes such phenomenon and is capable of solving the problems inherent in the conventional voltmeters as described in the foregoing.

More specifically, upon application of an electric field onto a piezo-electric element, a strain or deformation is produced in the piezo-electric element so as to vary elastic characteristics of said piezo-electric element. The variation in the characteristics as described above may be observed, for example, in the form of variation of resonance frequency for the piezo-electric element. In other words, propagation velocity, propagation loss, and propagation distance of surface acoustic waves are varied in correspondence to the electric field applied to the piezo-electric element, with a consequent variation in the oscillating frequency of a surface acoustic wave oscillator. Accordingly, when the construction and dimensions of the surface acoustic wave oscillator and materials, etc. for the piezo-electric element constituting the surface acoustic wave oscillator are properly determined, the impressed voltages may be found on the basis of the variations in the oscillating frequency thereof.

Figure 1:
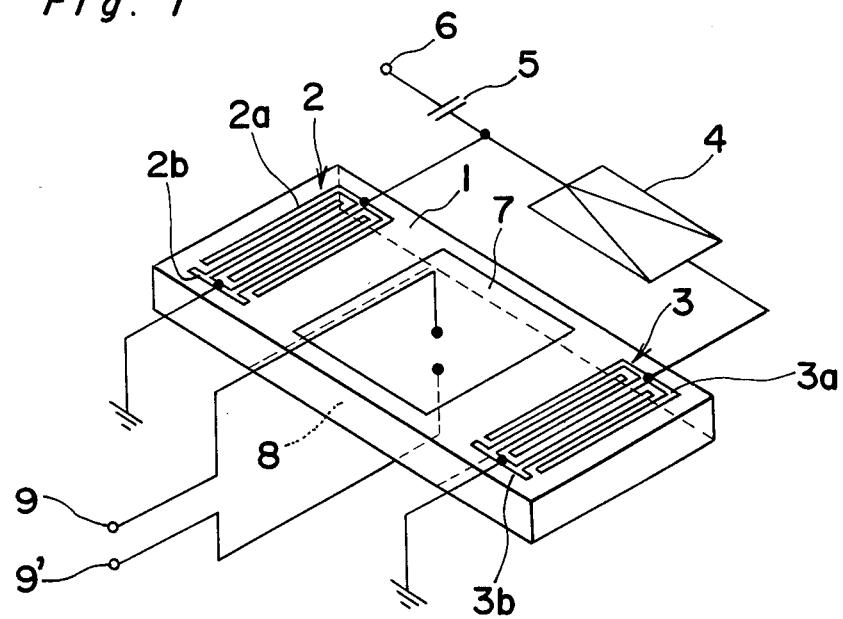
FIG. 1 is a schematic perspective view of an electrostatic voltage sensor for explaining a general construction and principle of operation thereof.

Referring now to the drawings, there is shown in FIG. 1, a general construction of a voltage measuring device or electrostatic voltage sensor (referred to as an electrostatic voltage sensor hereinbelow) earlier proposed by two of the present inventors, and fully disclosed in U.S. patent application Ser. No. 187,079 assigned to the same assignee as in the present invention, to which reference should be made for further details thereof.

In FIG. 1, the electrostatic voltage sensor includes a piezo-electric unit 1 of a generally rectangular plate-like configuration serving as a surface acoustic wave propagating member, which is formed by a piezo-electric material of ceremics such as a magnesium niobate titanate lead zirconate ($MgNbTiZrPbO_3$), or of single crystal such as lithium niobate ($LiNbO_3$), or the like. The piezo-electric unit 1 further includes a transmitting, or launching, transducer 2 and a receiving transducer 3 formed at opposite end portions of one flat main surface of the piezo-electric unit 1. The transmitting transducer 2 includes a pair of thin-film metal electrodes 2a and 2b 1 each arranged to have interleaved fingers, which are spaced apart from each other as shown. Similarly, the receiving transducer 3 includes electrodes 3a and 3b respectively having interleaved fingers in the similar manner as in the electrodes 2a and 2b. Provided between the transmitting and receiving transducers 2 and 3 is an electrode 7 deposited on the one flat main surface of the unit 1 for detecting external electric field. The electrode 7 is connected to a terminal 9 which is adapted to receive a voltage to be measured, while a counter electrode 8 which is connected to a terminal 9' is deposited on the other flat surface of the unit 1 facing the electrode 7, said terminals 9 and 9' serving as input terminals for applying voltages to be measured to said electrodes 7 and 8. The electrodes 2a, 2b, 3a, 3b, 7 and 8 can be formed by any known method, such as sputtering or vacuum depositing using a high electric conductive material such as aluminum or gold. The electrode 2a of the transducer 2 is connected to a reference signal producing circuit (not shown here) which produces a reference a.c. signal, and the electrode 2b is connected to ground. The elecrtrode 3a of the receiving transducer 3 is connected through an amplifier 4 to the electrode 2a for feeding the received signal back to the electrode 2a. The electrode 3b is connected to the ground. The output of the amplifier 4 is also connected through a capacitor 5 to a comparator (not shown here) which is also connected to the reference signal producing circuit. The output of the comparator is connected to a display unit (not shown here).

When the reference signal producing circuit is so actuated as to produce an a.c. signal having a predetermined central frequency, an alternating electric field is generated between the electrodes 2a and 2b that causes localized vibrations in the unit 1. These vibrations give rise to acoustic waves, which propagate along a path defined on the surface of the unit 1 in a direction perpendicular to the fingers of the electrodes, i.e., towards the receiving transducer 3. At the receiving transducer 3, the propagated acoustic waves are converted to a.c. signal which is fed through the amplifier 4 back to the electrode 2a so as to be again radiated from the transducer 2 in the form of the surface acoustic waves. When the signal from the electrode 3a is fed back to the electrode 2a, and if the phase of the fed back signal matches with the acoustic waves generated from the transducer 2, the voltage of the output a.c. signal from the transducer 3 saturates at a predetermined value to produce an oscillating signal from the output of the amplifier 4, and thus, an oscillator of feed-back oscillation type by the amplifier 4 is formed, with the output frequency being obtained through a terminal 6.

Upon impression of a voltage across the input terminals 9 and 9', corresponding electric fields are applied between the electrodes 7 and 8 of the piezo-electric unit 1 as the surface acoustic wave propagating member, and therefore, the unit 1 is subjected to deformation or strain, thereby to vary the length of path for the acoustic wave propagation. Meanwhile, upon variation of the impressed voltage with respect to the input terminals 9 and 9', the electric field to be applied between the electrodes 7 and 8 of the piezo-electric unit 1 is also changed, and since the length of the path for the surface acoustic waves is altered according to the change of the above electric field, output frequency is changed through variation in the phase conditions. Therefore, the output frequency described above is altered according to the voltage applied to the input terminals 9 and 9'.

More specifically, when an electric field is applied to the piezo-electric unit 1, the piezo-electric crystalline structure of the unit 1 is deformed to vary the effective length of path for the acoustic wave propagation between the transducers 2 and 3, and thus, the speed of propagation for the surface acoustic waves differs depending on presence or absence of electric fields on the piezo-electric unit 1. Based on the factors as described above, outputs with frequencies corresponding to input voltages applied to the input terminals 9 and 9' may be obtained at the terminal 6.

Incidentally, upon application of an external electric field or external stress to a piezo-electric member, strain or deformation occurs in the interior of the piezo-electric member, and when the external electric field or external stress is kept impressed thereto, there arises a so-called creep phenomenon, which is generally more conspicuously noticed in a sintered piezo-electric member than in a single-crystal piezo-electric member. Therefore, it is desirable to apply the voltage to be measured to the piezo-electric member through a capacitor or the like so as to lower the voltage substantially impressed to said piezo-electric member. However, in the case where the method as described above is merely applied to the arrangement as shown in FIG. 1, the voltage to be actually impressed to the piezo-electric unit 1 is reduced to a value approximately between a fraction and one several tens of the voltage directly applied. As a result, only a small voltage is to be impressed to the piezo-electric unit 1, and thus, the internal strain and the variation of the frequency of the oscillation output signal obtained from the output terminal 6 are also reduced, with a consequent reduction in the signal-to-noise ratio with respect to the noise. Moreover, since the piezo-electric member has a drift with respect to various conditions such as temperature, humidity, atmospheric pressure, supporting state (mechanical strain), etc., the frequency of the oscillation output signal to be obtained from the above output terminal 6 is also subjected to drifting.

Therefore, reduction of influences by the creep phenomenon and drift arising from the various conditions as described above becomes an essential requirement for realizing a voltage detecting and measuring device at high accuracy.

In the arrangement according to the present invention, the electrostatic voltage sensor is adapted to form strain or deformation in the surface acoustic wave propagation piezo-electric substrate by impressing voltage imparted to an objected to be measured, to said substrate for measuring said voltage through variation of oscillating frequency of the surface acoustic wave oscillator based on variation of surface acoustic wave delay time. Thus, the voltage sensor makes it possible to effect voltage measurements at high accuracy with favorable signal-to-noise ratio by altering the voltage to be impressed to the substrate at a predetermined frequency.

More specifically, according to the present invention, a separate voltage collecting member different from the electrode for impressing a voltage or electric field is provided on the surface acoustic wave delay medium or substrate, and the voltage obtained in said voltage collecting member is varied at the predetermined frequency for being applied to said electrode so as to detect the external voltage by the variation component of said oscillating frequency, and thus, the influences due to the creep phenomenon and various conditions described earlier are effectively alleviated.

Figure 2:
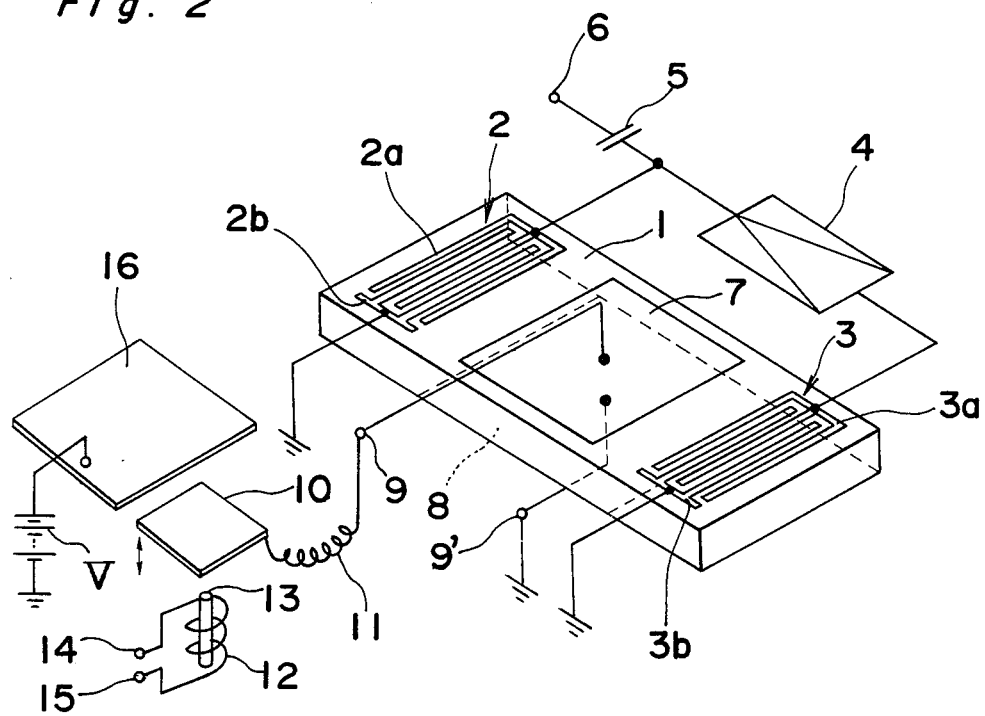
FIG. 2 is a schematic perspective view of an electrostatic voltage sensor according to one preferred embodiment of the present invention.

Referring now to the drawings, there is shown in FIG. 2 a voltage detecting device or electrostatic voltage sensor according to one preferred embodiment of the present invention, in which like parts in FIG. 1 are designated by like reference numerals and symbols for brevity of description.

In FIG. 2, the electrostatic voltage sensor includes, in the similar manner as in the arrangement of FIG. 1, the piezo-electric unit 1 or surface acoustic wave propagating medium formed by piezo-electric material as described earlier with reference to FIG. 1. The piezo-electric unit 1 further includes the transmitting transducer 2 provided with the pair of electrodes 2a and 2b each arranged to have the interleaved fingers spaced apart from each other, and the receiving transducer 3 provided with the electrodes 3a and 3b each having the spaced and interleaved fingers as in the electrodes 2a and 2b. The electrode 7 is formed between the transmitting and receiving transducers 2 and 3 on the one flat surface of the piezo-electric unit 1, and is connected to the terminal 9, while the counter electrode 8 connected to the terminal 9' and also to the ground is formed on the other flat surface of the unit 1 facing the electrode 7, with the amplifier 4 being coupled between the electrodes 7 and 8 for deriving the output from the terminal 6 through the capacitor 5 generally in the similar fashion as in FIG. 1. It is to be noted that the electrodes 7 and 8 may be formed in close contact with the flat surfaces of the piezo-electric unit 1 or at least either one of the electrodes 7 or 8 may be disposed in a spaced relation from said flat surface of the unit 1.

According to the arrangement of FIG. 2 directly related to the present invention, the terminal 9 for the lead wire connected to the electrode 7 is further connected to a voltage collecting member 10, for example, of a square plate-like shape, while the terminal 9' for the lead wire connected to the electrode 8 is grounded. The terminal 9 and the voltage collecting member 10 is connected to each other, for example, through a fine lead wire 11 which may be expanded or contracted as desired, but which should of course be held in a state sufficiently electrically insulative.

The voltage collecting member 10 is so arranged as to be vibrated in the vertical direction as shown by the arrows according to magnitude of coil driving voltage applied to terminals 14 and 15 for a coil 12 having a core 13 and provided below and adjacent to said voltage collecting member 10. It is to be noted here that the voltage collecting member 10 need not necessarily be arranged to be vibrated by the coil 12 including the core 13, but may be adapted to be vibrated by any other suitable means, and also that the direction of vibration is not limited to the vertical direction, but may be modified to back and forth or lateral direction or to a rotational direction depending on necessity.

The voltage collecting member 10 is disposed to confront a charging plate 16 for measurement (which is equivalent to a charging drum or the like in the case of an electrostatic copying apparatus), and is impressed with a voltage V as shown in FIG. 2.

Figure 3:
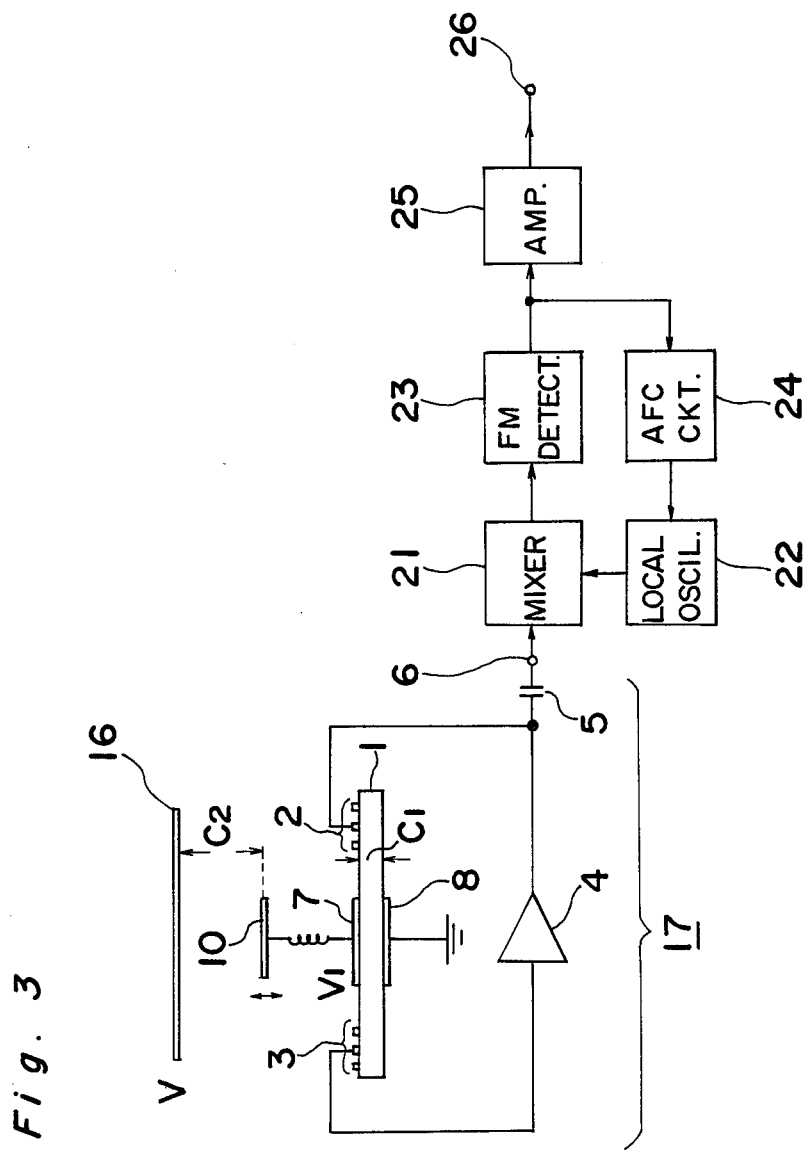
FIG. 3 is a block diagram showing a general construction of an electrostatic voltage sensor according to a second embodiment of the present invention.

In a block diagram of FIG. 3, the arrangement as described so far is schematically represented as a voltage measuring section 17.

On the assumption here that an electrostatic capacity of a capacitor to be formed between the charging plate 16 and the voltage collecting member 10 is denoted by $C_2$, and an electrostatic capacity of a capacitor to be formed between the electrodes 7 and 8 of the piezo-electric member 1 is represented by $C_1$, a voltage $V_1$ produced on the electrode 7 of the piezo-electric unit 1 is equal to the potential of the voltage collecting member 10 so as to have a value obtained by dividing the potential V into the ratio of $C_1$ and $C_2$, i.e. value represented by the relation $V_1 = C_2 \times V/(C_1 + C_2)$. In the above case, when the voltage collecting member 10 is caused to vibrate at a frequency f1 as shown in FIG. 2, the electrostatic capacitance C2 between the charging plate 16 and the voltage collecting member 10 varies at the frequency f1. Therefore, based on the above equation, the potential V1 of the electrode 7 similarly varies at the frequency f1, and in other words, this is equivalent to variation of the voltage applied to the external electric field detecting electrode 7 at the frequency f1, and accordingly, the frequency f of the oscillation signal developed from the output terminal 6 in FIG. 3 is derived as a signal (FM signal) subjected to the frequency modulation at the vibrating frequency f1 of the voltage collecting member 10.

Referring particularly to FIG. 3 showing the block diagram of an electrostatic voltage sensor according to a second embodiment of the present invention, the output terminal 6 of the voltage measuring section 17 is connected to a mixer 21 which is coupled to an amplifier 25 through an FM detector 23, while a line connecting the FM detector 23 and the amplifier 25 is connected to an AFC circuitry 24 (Automatic Frequency Control circuitry) which is coupled to the mixer 21 through a local oscillator 22.

In FIG. 3, the FM signal output obtained by the voltage measuring section 17 is led, through the output terminal 6, to the mixer 21, where mixing of the signal output with the signal from the local oscillator 22 is effected for FM detection by the FM detector 23, while the detection output is amplified by the amplifier 25 so as to be developed from an output terminal 26 for the amplifier 25.

In connection with the above, time constant for the drift of the output frequency from the voltage measuring section 17 due to the creep phenomenon, temperature and various other conditions of the piezo-electric unit 1 described earlier is found to be in the range of 0.1 to 10 seconds based on the experiments carried out by the present inventors, and thus, by the drift as described above, the output does not necessarily represent a correct value.

Therefore, according to the present invention, it has been so arranged that the output of the FM detector 23 is fed back to the local oscillator 22 through the AFC circuitry 24 so as to cancel the frequency drift of the output signal from the voltage measuring section 17 for maintaining the output frequency of the mixer 21 constant at all times, with the time constant for variation of the fed back voltage of the AFC circuitry 24 being set to be less than 10 seconds in the above case.

Figure 4:
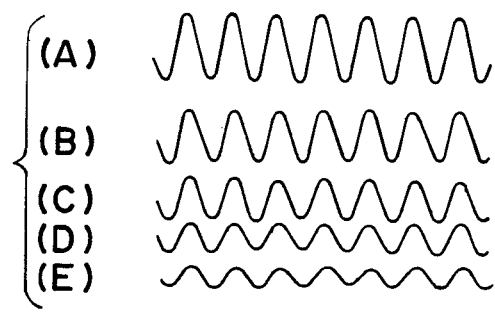
FIG. 4 is a diagram showing waveforms of outputs from the electrostatic voltage sensor of FIG. 3.

In FIG. 4 showing output waveforms in the circuit arrangement constructed in the manner as described so far, (A), (B), (C), (D) and (E) represent the output waveforms when the voltages V applied to the charging plate 16 in FIG. 3 are +1000 V, +800 V, +600 V, +4000 V and +2000 V respectively, with the vibrating frequency of the voltage collecting member 10 being set at approximately 140 Hz.

Figure 5:
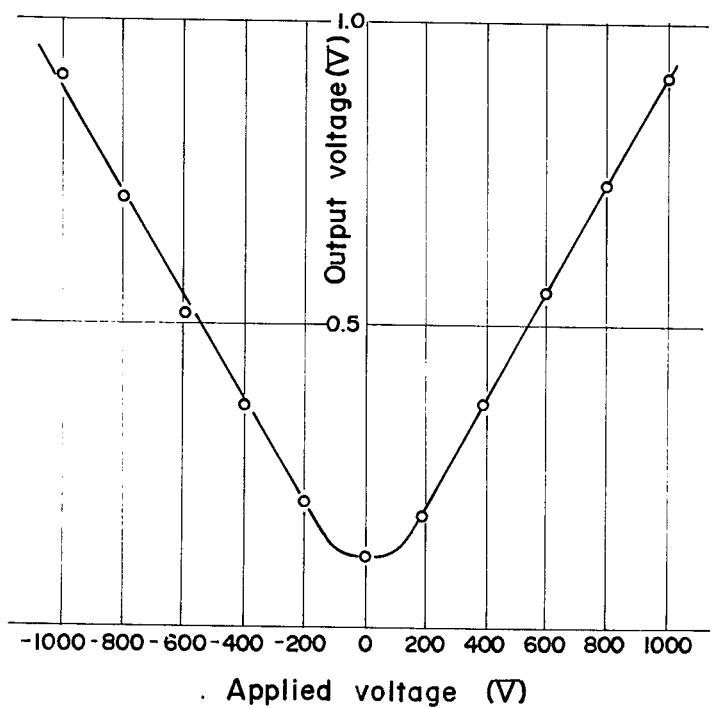
FIG. 5 is a graph showing the relation between voltages applied to an object to be measured and output voltages in the electrostatic voltage sensor of FIG. 3.

Similarly, results as obtained by negative applied voltages are given in a graph of FIG. 5, which is prepared by converting the results obtained as in FIG. 4 into DC voltages through detection for plotting. With respect to the vibrating frequency of the voltage collecting member 10, favorable results were obtained when the frequency was higher than the reciprocal of the output frequency drift time constant for the earlier described voltage measuring section 17.

In the foregoing embodiments, although the present invention has been mainly described with reference to the case where the electric field applied to the piezo-electric unit is varied through periodical displacement of the voltage collecting member, the method for varying the impressed electric field is not limited to the above practice, but may also be effected, for example, in such a manner that, with charged regions and non-charged regions being alternately disposed in portions which will present no particular inconvenience for the actual use of the charged member, the voltage collecting member is caused to confront such portions so as to move the charged member, with the voltage collecting member being held in a fixed state, thus making it possible to periodically vary the applied electric field. The charged regions and non-charged regions as described above may be constituted by alternately disposing dielectric members and electrically conductive members.

Figure 6:
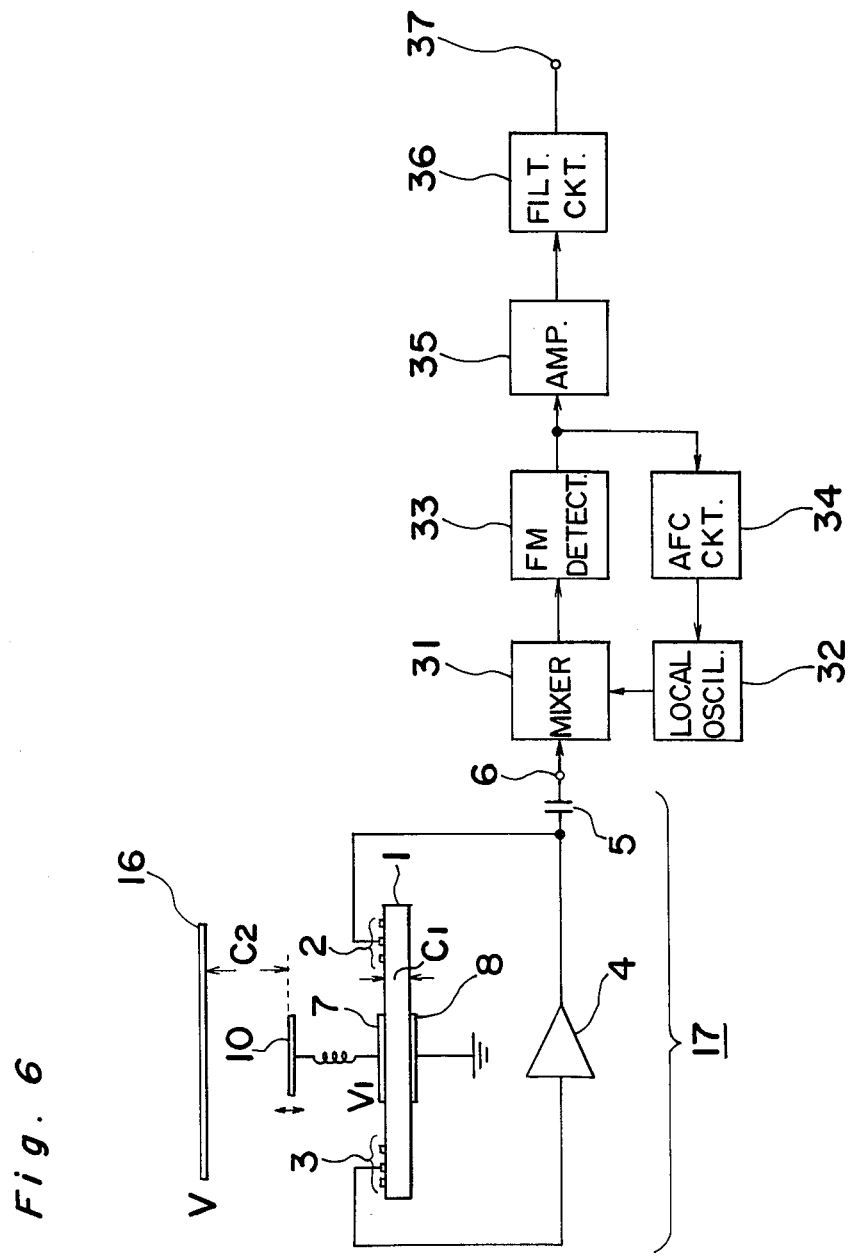
FIG. 6 is a block diagram similar to FIG. 3, which particularly shows a general construction of an electrostatic voltage sensor according to a third embodiment of the present invention.

Reference is further made to FIG. 6 showing a third embodiment according to the present invention.

It is to be noted here that in the arrangement of FIG. 6, the voltage measuring section 17 has the same constructions and functions as those of the voltage measuring section 17 shown in FIG. 3.

In the arrangement of FIG. 6, the output terminal 6 of the voltage measuring section 17 is connected through a mixer 31 and an FM detector 33, to an amplifier 35 which is further coupled to a filtering circuitry 36, with a line connecting the FM detector 33 and the amplifier 35 being coupled, through an AFC circuitry 34 and a local oscillator 32, to said mixer 31.

In the above arrangement of FIG. 6, the FM signal output derived from the voltage measuring section 17 is led, through the output terminal 6, to the mixer 31, where mixing of the signal output with the signal from the local oscillator 32 is effected for FM detection by the FM detector 33, while the detection output is amplified by the amplifier 35 so as to be fed to a filter 36 for developing frequency component as described later from an output terminal 37.

In connection with the above, time constant for the drift of the output frequency from the voltage measuring section 17 due to the creep phenomenon and various conditions of the piezo-electric unit 1 is found to be in the range of 0.1 to 10 seconds from the experiments carried out by the present inventors, as stated earlier, and thus, by the drift as described above, the output does not necessarily represent a correct value in this embodiment, either.

Therefore, in the above embodiment of FIG. 6, it has also been so arranged that the output of the FM detector 33 is fed back to the local oscillator 32 through the AFC circuitry 34 so as to cancel the frequency drift of the output signal from the voltage measuring section 17 for maintaining the output frequency of the mixer 31 constant at all times, with the time constant for variation of the fed back voltage of the AFC circuitry 34 being set to be less than 10 seconds in the above case.

Incidentally, in the case where the arrangement as described in the foregoing is applied, for example, to an electrophotographic copying machine, it is common that numerous noises such as noises due to vibrations, noises arising from ionic flow developed by a charging corona charger, noises generated from power source lines, etc. are simultaneously present, and in some cases, such noise components are larger than the signal component which is actually required. Therefore, it becomes necessary to process the output signal including considerable amounts of noises to obtain the signal component originally required.

Figure 7:
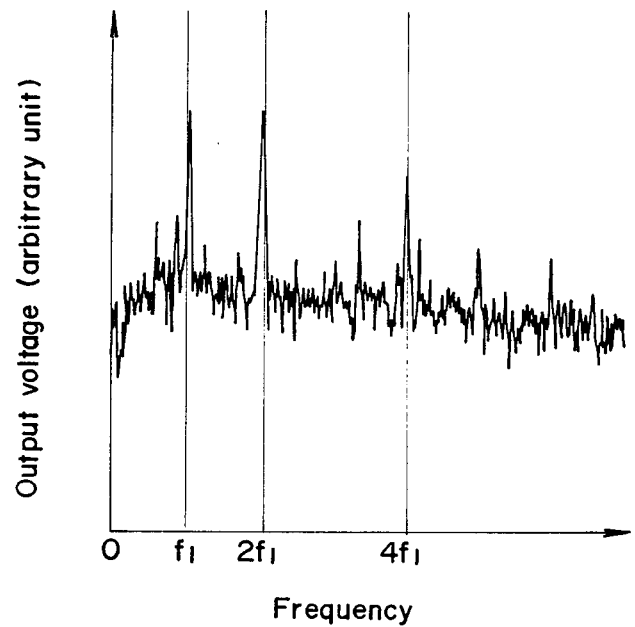
FIG. 7 is a graph showing one example of frequency power spectrum of the output signal from an amplifier employed in the electrostatic voltage sensor of FIG. 6.

In FIG. 7, there is shown a graph representing one example of frequency power spectrum of the output signal from the amplifier 35, in which the frequency is taken on the abscissa and output, on the ordinate, with the frequency f1 in the graph denoting the vibrating frequency of the voltage collecting plate 10.

Here, on the assumption that the voltage for the charging plate 16 is raised, while the voltage collecting plate 10 is held in a vibrating state at the frequency $f_1$, outputs of the components for the frequencies $f_1$, $2f_1$, $4f_1$, ..., and $nf_1$ in FIG. 7 are proportionally increased correspondingly. On the contrary, other components, i.e. noise components are not appreciably changed in the magnitude thereof, and remain as they are. Therefore, by extracting at least one of such frequency components $f_1$, $2f_1$, $4f_1$, ... and $nf_1$ by the filter, signal with a favorable signal-to-noise ratio may be obtained.

The filter circuitry 36 in FIG. 6 is one provided on the basis of the above finding. More specifically, the filter circuitry 36 is arranged to selectively pass at least one of the frequency components, with the frequency $f_1$ or an integer multiple thereof being set as a central frequency.

Incidentally, main noise components included in the output from the amplifier 35 include noises due to vibrations of the voltage collecting plate 10, although there are of course included numerous components other than the above. According to the experiments carried out by the present inventors, mixing of noises into signals more or less could not be avoided, although different in degrees, even when any countermeasures were taken for prevention of noises.

In the case where the amplitude of the signal component is sufficiently large as compared with that of the noise component, i.e. when the voltage V to be measured is high or the voltage to be impressed to the electrode 7 from the voltage collecting plate 10 is high, it is possible to selectively derive the component of the frequency $f_1$ by the filter circuitry 36 for subsequent detection of the voltage V to be measured.

Meanwhile, in the case where the magnitude of the amplitude for the component of the noise frequency $f_1$ is too large to be ignored as compared with the amplitude of the component of the signal frequency $f_1$ due to low voltage V to be measured or low voltage to be supplied to the electrode 7 from the voltage collecting plate 10, separation of the signal from the noise becomes difficult. In the case as described above, it may be so arranged that, by selectively taking out the component of the integer multiple of the frequency $f_1$, i.e. any one of the components for the frequencies $2f_1$, $4f_1$ and $nf_1$, by the filter circuitry 36, the value of the voltage V is found based thereupon. According to the experiments conducted by the present inventors, it has been found that, upon utilization of the frequency component of $2f_1$ of these components, separation between the signal and noise becomes most effective, and the signal-to-noise ratio thereof is improved by about 40 dB as compared with that of the output signal from the amplifier 25.

Figure 8:
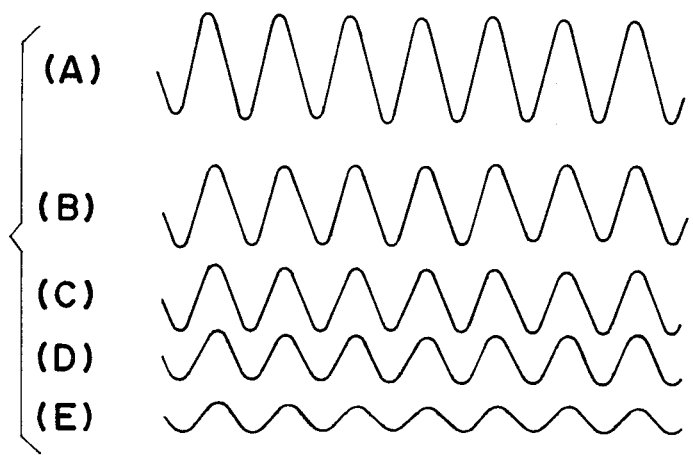
FIG. 8 is a diagram showing waveforms of outputs from the electrostatic voltage sensor of FIG. 6.

In FIG. 8, showing waveforms of the output signals when only $f_1$ component is derived by the filter circuitry 36 in the circuit arrangement as described above, (A), (B), (C), (D) and (E) represent the output waveforms when the voltages V applied to the charging plate 16 are +1000 V, 800 V, +600 V, +400V and +200 V respectively, with the frequency for the above output waveforms being at 144 Hz. It is to be noted here that similar results were obtained in the waveforms even when only the $2f_1$ component was taken out.

Figure 9:
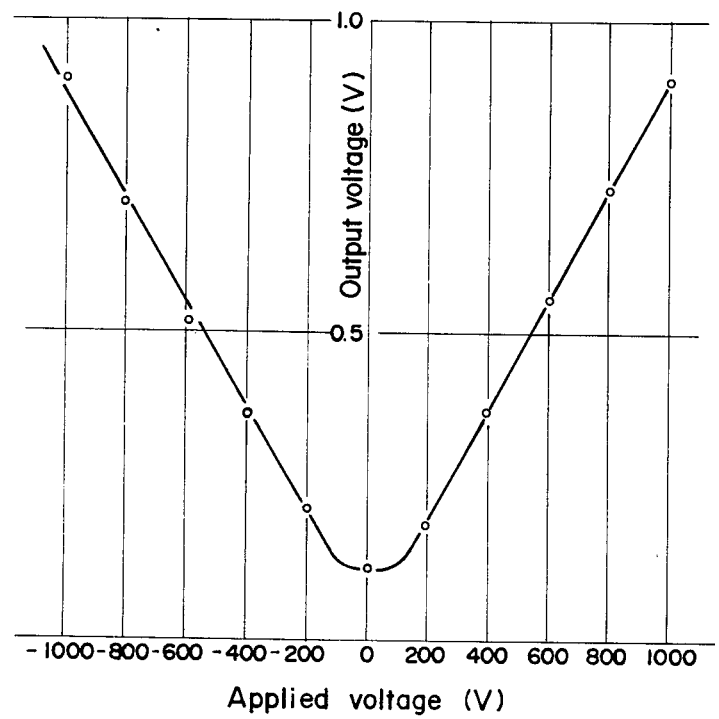
FIG. 9 is a graph showing the relation between voltages applied to an object to be measured and output voltages in the electrostatic voltage sensor of FIG. 6.

Similarly, results as obtained by negative applied voltages are given in a graph of FIG. 9, which is prepared by further detecting the output signal of the filter circuitry 36 to obtain a DC voltage for finding the relation thereof with respect to the voltage applied to the charging plate 16. In the above case also, favorable results were obtained when the vibrating frequency of the voltage collecting plate was higher than the reciprocal of the output frequency drift time constant for the earlier described voltage measuring section 17.

In the above embodiment, although the present invention has been mainly described with reference to the case where the electric field applied to the piezo-electric unit is varied through periodical displacement of the voltage collecting member, the method for varying the impressed electric field is not limited to the above practice, but may also be effected, for example, in such a manner that, with charged regions and non-charged regions being alternately disposed in portions which will present no particular inconvenience for the actual use of the charged member, the voltage collecting member is caused to confront such portions so as to move the charged member, with the voltage collecting member being held in a fixed state, thus making it possible to periodically vary the applied electric field. The charged regions and non-charged regions as described above may be constituted by alternately disposing dielectric members and electrically conductive members.

Figure 10:
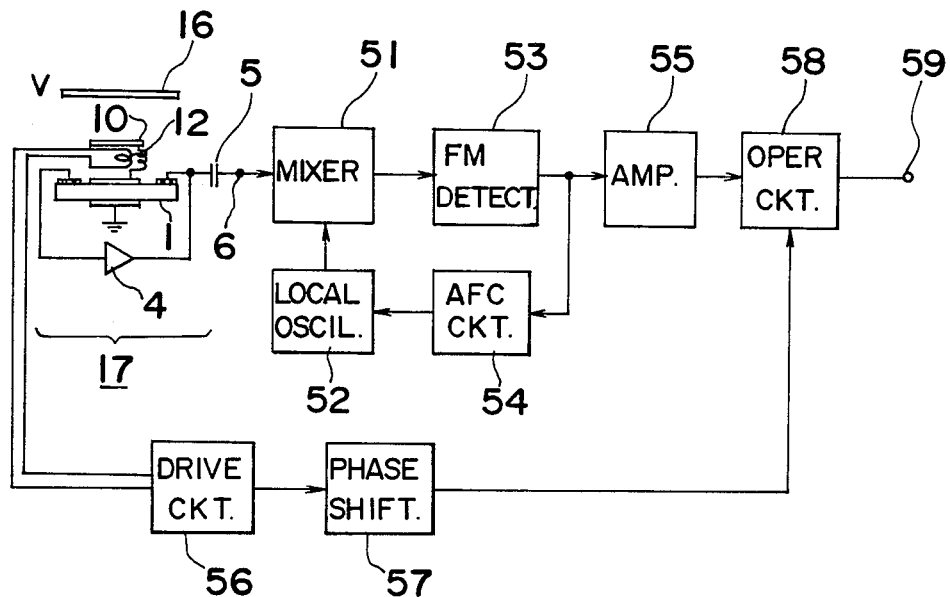
FIG. 10 is a block diagram similar to FIG. 3, which particularly shows a general construction of an electrostatic voltage sensor according to a fourth embodiment of the present invention.

Reference is further made to FIG. 10 showing a fourth embodiment according to the present invention.

It is to be noted here that in the arrangement of FIG. 10 also, the voltage measuring section 17 has the same constructions and functions as those of the voltage measuring section 17 shown in FIGS. 2 and 3, with like parts are designated by like reference numerals for brevity of description.

In the arrangement of FIG. 10, the output terminal 6 of the voltage measuring section 17 is connected, through a mixer 51 and an FM detector 53, to an amplifier 55 which is further coupled to an operational circuitry 58, with a line connecting the FM detector 53 and the amplifier 55 being coupled, through an AFC circuitry 54 and a local oscillator 52, to said mixer 51, while the coil 12 for the voltage measuring section 17 is coupled to the operational circuitry 58 through a driving circuitry 56 and a phase shifter 57.

In FIG. 10, the FM signal output obtained by the voltage measuring section 17 is led, through the output terminal 6, to the mixer 51, where mixing of the signal output with the signal from the local oscillator 52 is effected for FM detection by the FM detector 53, while the detection output is amplified by the amplifier 55 so as to be developed from an output terminal 59 for the circuitry 58.

In connection with the above, time constant for the drift of the output frequency from the voltage measuring section 17 due to the creep phenomenon, temperature and various other conditions of the piezo-electric unit 1 described earlier is also found to be in the range of 0.1 to 10 seconds based on the experiments effected by the present inventors, and thus, by the drift as described above, the output does not necessarily represent a correct value, either.

Therefore, in the embodiment of FIG. 10, it has also been so arranged that the output of the FM detector 53 is fed back to the local oscillator 52 through the AFC circuitry 54 so as to cancel the frequency drift of the output signal from the voltage measuring section 17 for maintaining the output frequency of the mixer 51 constant at all times, with the time constant for variation of the fed back voltage of the AFC circuitry 54 being set to be less than 10 seconds.

Incidentally, in the case where the arrangement as described in the foregoing is applied, for example, to an electrophotographic copying machine and the like, it is common that numerous noises such as noises due to vibrations, noises arising from ionic flow developed by a charging corona charger, noises generated from power source lines, etc. are simultaneously present, and in some cases, such noise components are larger than the signal component which is actually required. Therefore, it becomes necessary to process the output signal including considerable amounts of noises to obtain the signal component originally required.

Figure 11:
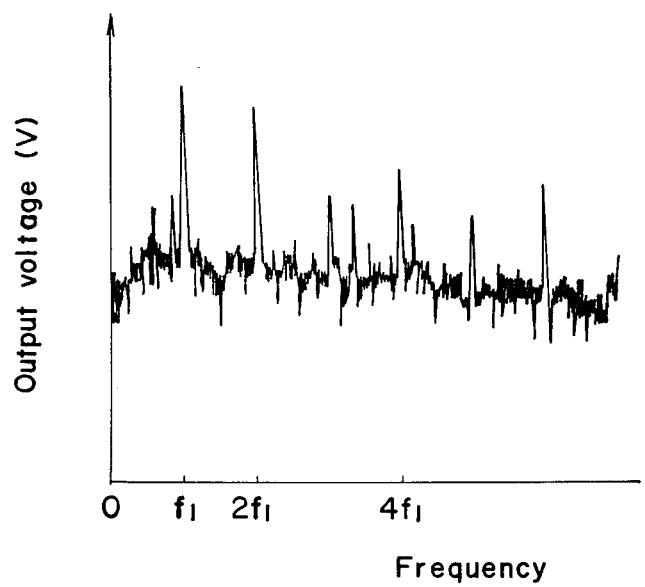
FIG. 11 is a graph showing one example of frequency power spectrum of the output signals in the electrostatic voltage sensor of FIG. 10.

In FIG. 11, there is shown a graph representing one example of frequency power spectrum of the output signal from the amplifier 55 in the above arrangement, excluding the circuit elements 56, 57 and 58 to be described later, in which graph, the frequency is taken on the abscissa and output, on the ordinate, with the frequency $f_1$ in the graph denoting the vibrating frequency of the voltage collecting plate 10.

Here, on the assumption that the voltage for the charging plate 16 is raised, while the voltage collecting plate 10 is held in a vibrating state at the frequency $f1$, outputs of the components for the frequencies $f_1$, $2f_1$, $4f_1$, ... and $nf_1$ in FIG. 11 are proportionally increased correspondingly. On the contrary, other small outputs, i.e. noise components are not appreciably changed in the magnitude thereof, and remain as they are. Therefore, in the region where the potential obtained in the voltage collecting plate 10 is high, it is possible to measure the potential by directing attention to the component of the frequency $f1$.

Incidentally, in the noise components as described above noises due to vibrations of the voltage collecting plate 10 and also noises at the frequency $f_1$ arising from the driving magnetic field by the coil 12 for driving the voltage collecting plate 10 can not be ignored in this case. According to the experiments conducted by the present inventors, undesirable mixing of noises into signals more or less could not be avoided, although different in degrees, even when any countermeasures were taken for prevention of noises. Therefore, the signal and noise come to have the same frequency power spectrum, and in the region where potential is low, separation of the signal at frequency $f_1$ from the noise becomes difficult.

According to the results of investigations carried out by the present inventors, it has been found that, in the power spectra in FIG. 11, through calculation processing by the signal of driving frequency $f_1$ of the voltage collecting plate 10, of the spectrum component of frequency $f_1$ when the potential to be measured is high, and the spectrum component two times, 4 times, ... and so forth of the frequency $f_1$ when the potential to be measured is low, signal having favorable signal to noise ratio may be obtained.

The circuit elements for the above calculation are represented by the driving circuitry 56 for generating a driving signal for causing the voltage collecting plate 10 to vibrate, a phase shifter 57 to vary the phase of the output signal of the driving circuitry 56 for phase alignment with respect to the output signal of the amplifier 25, and the operational circuitry 58 for effecting multiplication of the output signal of the phase shifter 57 and that of the amplifier 55. The output signal of the driving circuitry 56 is also supplied to the driving coil 12 for causing the voltage collecting member 10 to vibrate. The output of the arrangement of FIG. 10 is developed from the output terminal 59.

By the above arrangement, when the voltage collecting plate 10 is caused to vibrate through oscillation of the driving circuitry 56, output signal as shown in FIG. 11 is developed from the amplifier 55 by the action of the mixer 51, local oscillator 52, FM detector 53, and AFC circuitry 54. Meanwhile, part of the oscillation output of the driving circuitry 56 is subjected to phase alignment with the output signal of the amplifier 55 at the phase shifter 57 so as to be impressed to the operational circuitry 58, which is mainly constituted by a multiplication circuitry and arranged to multiply the output signal from the amplifier 55 including noise component, by the signal at frequency $f1$ from the phase shifter 57. According to the experiments made by the present inventors, the output signal from the amplifier 55 was purified by the above calculation processing, with an improvement of the signal-to-noise ratio by above 50 dB as compared with that before the calculation processing. Therefore, it is possible to detect the potential to be measured at high accuracy from the magnitude of the spectrum of the frequency $f_1$.

As described earlier, when the potential to be measured is comparatively low, it becomes impossible to ignore the influences by the oscillation output (frequency $f_1$) of the driving circuitry 56 through the power source line, ground line, etc., thus increasing errors in the measurements. However, upon review of the frequency power spectrum in FIG. 11, output component of a sufficient magnitude is observed even at the frequency of integer multiples of the frequency $f_1$. Therefore, by deriving the output components of integer multiples of the frequency $f_1$, for example, output components two times or four times thereof, i.e. by eliminating the frequency $f_1$ components as noises, the signal-to-noise ratio may be improved still further.

Figure 12:
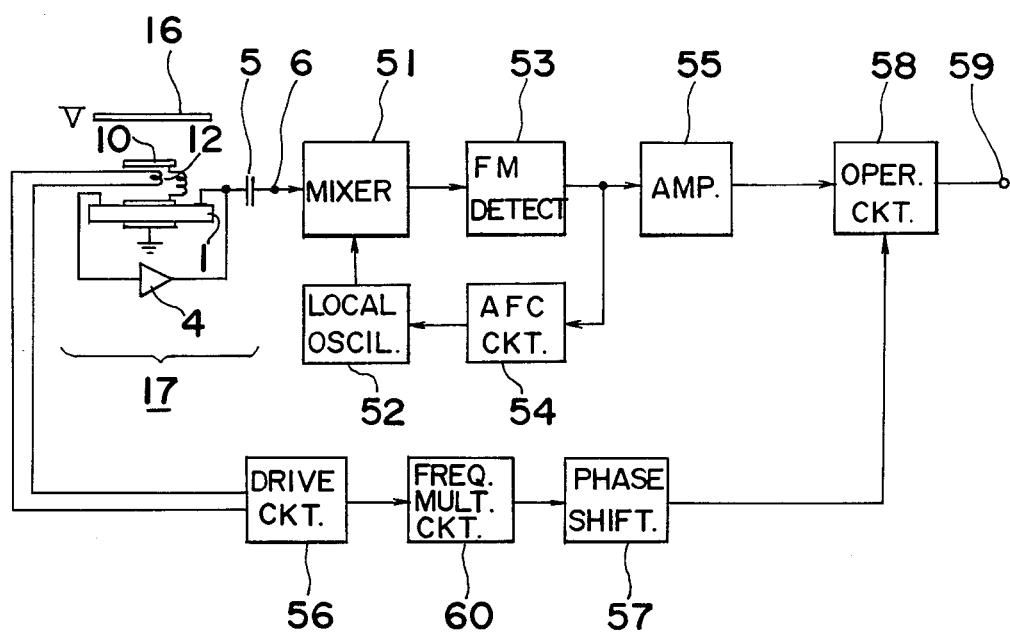
FIG. 12 is a block diagram similar to FIG. 3, which particularly shows a general construction of an electrostatic voltage sensor according to a fifth embodiment of the present invention.

Referring further to FIG. 12, there is shown a circuit arrangement according to a fifth embodiment of the present invention which is constructed, with special attention directed to the component n times the frequency $f_1$ (n : integer).

The circuit arrangement of FIG. 12 is particularly different from the arrangement of FIG. 10 in that a frequency multiplication circuitry 60 for obtaining output n times the oscillation output of the driving circuitry 56 is further inserted between the driving circuitry 56 and the phase shifter 57, although other circuit constructions are generally similar to those in FIG. 10 and designated by like reference numerals for brevity of description.

By the arrangement of FIG. 12, voltages to be measured may be readily detected based on the $nf_1$ component of the amplifier 55. According to the experiments conducted by the present inventors, it has been found that the signal-to-noise ratio can be improved by about 70 dB.

Figure 13:
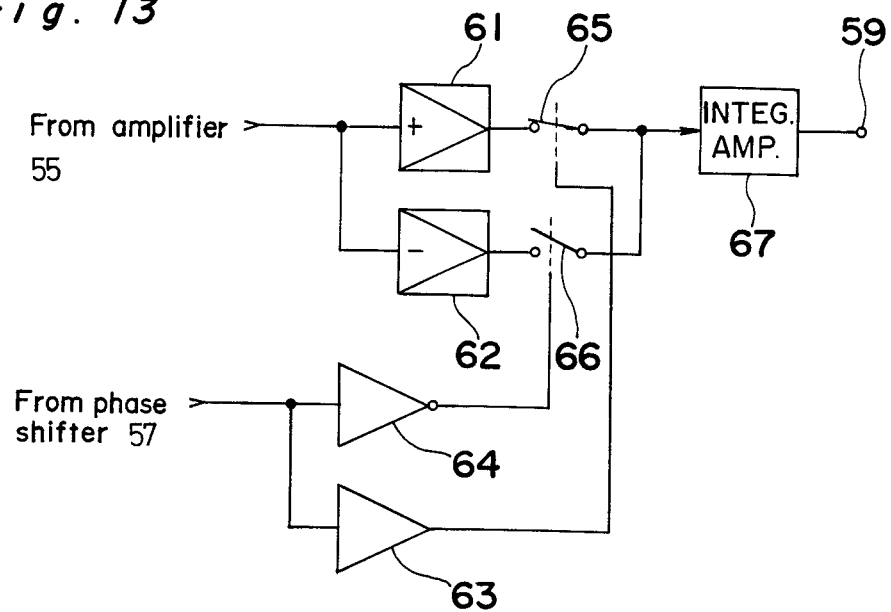
FIG. 13 is a block diagram showing one example of the construction of a calculating circuit employed in the electrostatic voltage sensor of FIG. 12.

Reference is also made to a block diagram of FIG. 13 showing one example of the circuit construction for the operational circuitry 58 employed in the arrangement of FIG. 12.

In the block diagram of FIG. 13, the line from the amplifier 55 is connected to a non-inverting amplifier 61 and an inverting amplifier 62 respectively for non-inversion and inversion amplifications of the output signal from said amplifier 55 including noises, and the output terminals of the amplifiers 61 and 62 are further coupled, through switching elements 65 and 66, to an integrator amplifier 67. Meanwhile, the line from the phase shifter 57 is connected to a non-inverting buffer amplifier 63 and inverting buffer amplifier 64 respectively intended to output the frequency signal of $f_1$ or $nf_1$ in the form of non-inverted and inverted zero-crossing signals, and arranged to function so as to drive the switching elements 65 and 66 connected to the output terminals of the non-inverting amplifier 61 and the inverting amplifier 62.

More specifically, in the above arrangement, during the positive half-period of the signal at the frequency $f_1$, the buffer amplifier 63 functions to close the switching element 65, and thus, the signal from the non-inverting amplifier 61 is led to the integrator amplifier 67. Meanwhile, during the negative half-period of the signal at the frequency $f_1$, the buffer amplifier 64 is caused to function to close the switching element 66, and thus, the signal from the inverting amplifier 62 is impressed to the integrator amplifier 67. In the above case, the signal from the inverting amplifier 62 comes to have a signal with the same sign as that of the signal from the non-inverting amplifier 61. Therefore, in the integrator amplifier 67, signal component to be a signal synchronized with the signal of frequency $f_1$ is input with the same sign, and thus, a predetermined integrated value is obtained. However, since random noises not synchronized with the signal of frequency $f_1$ may be reduced to zero in terms of average by increasing the integration time constant of the integrator amplifier 67, the noises are almost eliminated by the integrating effect, and therefore, the signal-to-noise ratio can be remarkably improved. Meanwhile, in the case where the input signals of the buffer amplifiers 63 and 64 are of integer multiples of the frequency $f_1$ components formed into noises through induction by the oscillating output (frequency $f_1$) of the driving circuitry 56 as described earlier are advantageously eliminated, and thus, further improvements of the signal-to-noise ratio may be achieved. In this case, favorable results have been obtained particularly when the frequency is of $2f_1$.

Figure 14:
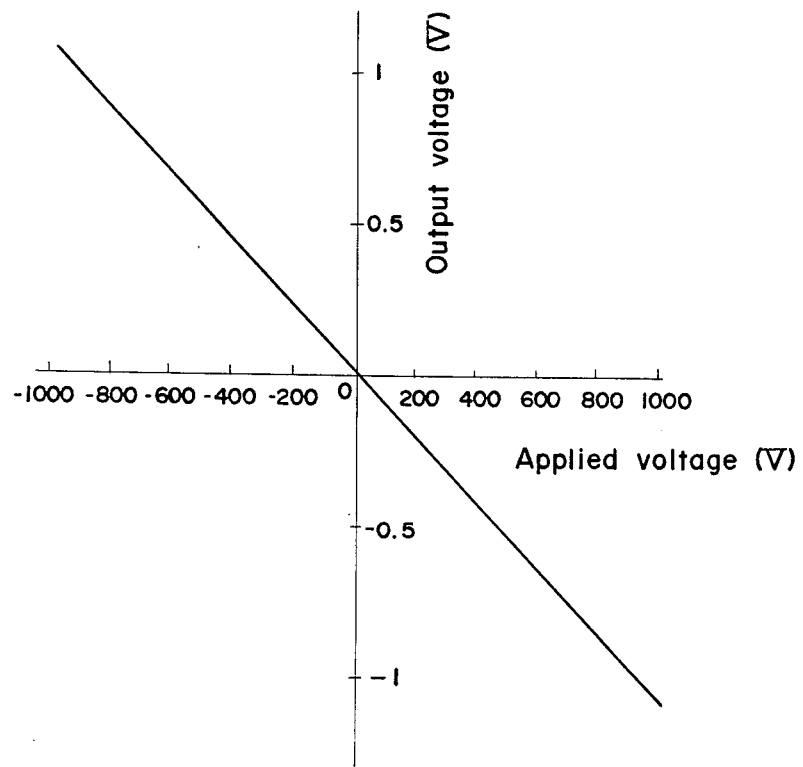
FIG. 14 is a graph showing the relation between voltages applied to an object to be measured and output voltages in the electrostatic voltage sensor of FIG. 12.

In FIG. 14, there is shown one example of characteristics of the output voltage obtained by altering the potential of the charging plate 16.

It should be noted here that, in FIG. 14, although negative (positive) output voltages are shown to be obtained by positive (negative) impressed voltages, it is of course quite simple to obtain positive (negative) output voltages with respect to positive (negative) impressed voltages through inversion of the switching elements 65 and 66. It should further be noted that, in the embodiment of FIG. 13, the negative cycle of the signal is also utilized, but needless to say, only either one of the positive or negative cycle may of course be utilized for the purpose.

The phase shifter 57 intended to determine the timing of the calculation in the operational circuitry 58 is so adjusted as to render the output signal obtained at the output terminal 59 to be maximum. Meanwhile, with respect to the oscillating frequency of the voltage collecting member 10, favorable results have been obtained so far as the frequency is higher than the reciprocal of the output frequency drift time constant of the voltage measuring section 17 described earlier.

It is to be noted here that in the above embodiment also, the present invention has been chiefly described with reference to the case where the electric field applied to the piezo-electric unit i.e. surface acoustic wave propagating member is varied through periodical displacement of the voltage collecting member, but the method for varying the impressed electric field is not limited to the above practice, but may also be effected, for example, in such a manner that, with charged regions and non-charged regions being alternately disposed in portions which will present no particular inconvenience for the actual use of the charged member, the voltage collecting member is caused to confront such portions so as to move the charged member, with the voltage collecting member being held in a fixed state, and thus, it is made possible to periodically vary the applied electric field. The charged regions and non-charged regions as described above may be constituted by alternately disposing dielectric members and electrically conductive members.

As is clear from the foregoing description, in the electrostatic voltage sensor according to the present invention, since it is so arranged that, through impression of electric field corresponding to the voltage to be measured, to the surface acoustic wave propagating member of the acoustic surface wave oscillation device, voltages are measured by the frequency variations thereby, the input impedance of the voltage to be measured is very high. In other words, the surface acoustic wave delay medium made of piezo-electric material shows input impedance equal to or higher than that in the existing vacuum tube voltmeters, etc. Moreover, since the upper limit value of the voltage that can be measured is determined by the dielectric strength of the surface acoustic wave delay medium, it is on the order higher than $10^3$ V. With respect to the stability against temperature variations also, values less than 10 ppm/°C. may readily be achieved through proper selection of the constructions or constituting materials, or addition of temperature compensating means.

Moreover, according to the arrangement of the present invention, to the electrode for applying electric field or voltage to the surface acoustic wave delay medium, voltage of the voltage collecting member separately provided therefrom is impressed through variation thereof by the particular frequency, and therefore, the output signal obtained is of frequency modulated signal. By detecting the frequency variation component of the above frequency modulated signal, it becomes possible to detect the voltage to be measured. Furthermore, in cases where the influences by the creep phenomenon and other drift factors for the frequency can not be ignored according to the constituting material of the surface acoustic wave delay medium, or where a still higher measuring accuracy is required, frequency drift of the output signal may be offset through variation of the oscillating frequency of the local oscillator by the automatic frequency control or AFC circuitry according to the output of the FM detector, while the mixer, local oscillator, FM detector, and AFC circuitry are connected to the output terminal. For actual applications, it may be so arranged that the time constant for the feed-back voltage variation of the above AFC circuitry is set to be less than 10 seconds and above the value of the reciprocal of the frequency for the voltage to be applied to the electrode from the voltage collecting member.

By the arrangement of the present invention in which the particular frequency component is obtained by the calculation processing so as to detect the potential to be measured thereby, it is possible to measure potentials at high accuracy, with an extremely favorable stability against noises and a sufficiently high single-to-noise ratio for the output signals.

The electrostatic voltage sensor according to the present invention described so far is not limited in its application merely to voltmeters and potentiometers, but may be readily applied to end uses for control through detection of voltage or potential, for example, to detection of charging degrees of toner in an electrostatic copying apparatus or the like.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. An electrostatic voltage sensor which comprises at least a surface acoustic wave propagating medium composed of a piezo-electric material, said piezo-electric material being substantially an insulator, a pair of transmitting and receiving transducer means for transmitting and receiving a surface acoustic wave provided on said surface acoustic wave propagating medium, an oscillating means including an amplifier having its input terminal connected to said receiving transducer means and having its output terminal connected to said transmitting transducer means, an electrode means for applying an electric field in a direction perpendicular to a major surface of said medium on which said surface acoustic wave propagates, and a voltage collecting member disposed in the vicinity of an object whose voltage is to be measured and connected to said electrode means, a voltage varying means for varying a voltage which is supplied to said electrode means from said voltage collecting member at a predetermined constant frequency, and a voltage detecting means for detecting said voltage of said object whose voltage is to be measured by detecting an output frequency of said oscillating means, wherein said voltage detecting means includes a mixing circuit whose input is connected to said receiving transducer, a frequency modulation detecting circuit which is connected to an output of said mixing circuit, and a local oscillation circuit.

2. An electrostatic voltage sensor as claimed in claim 1, wherein said voltage detecting means includes a frequency modulation detecting circuit which is supplied with an output from said receiving transducer means and a filtering circuit which is supplied with an output signal from said frequency modulation detecting circuit, said filtering circuit being arranged to derive, from said output signal from said frequency modulation detecting circuit, a frequency component of said voltage supplied to said electrode means from said voltage collecting member or an integral multiple thereof for detecting said voltage of said object whose voltage is to be measured by said frequency component.

3. An electrostatic voltage sensor as claimed in claim 2, further comprising an automatic frequency control circuit which is supplied with a detection output of said frequency modulation detecting circuit, and a local oscillation circuit which has its oscillating frequency controlled by said automatic frequency control circuit and which supplies its oscillation output signal to said mixing circuit, and said filtering circuit which is connected to an output of said frequency modulation detecting circuit.

4. An electrostatic voltage sensor as claimed in claim 1, further comprising a circuit for calculating and processing a detection output from said frequency modulation detecting circuit and a signal at frequency said voltage supplied to said electrode means or a signal at frequency corresponding to an integer multiple thereof, so as to obtain said frequency component of said voltage or said frequency component corresponding to an integer multiple thereof for detecting said voltage of said object whose voltage to be measured by said component.

5. An electrostatic voltage sensor as claimed in claim 1, further comprising an automatic frequency control circuit which is supplied with a detection output of said frequency modulation detecting circuit, and a local oscillation circuit which has its oscillating frequency controlled by said automatic frequency control circuitry.

* * * * *